US010374185B2

(12) United States Patent
Chen

(10) Patent No.: US 10,374,185 B2
(45) Date of Patent: Aug. 6, 2019

(54) OLED DISPLAY DEVICE HAVING WHITE OLEDS EMITTING WHITE LIGHT TO EXCITE QUANTUM DOTS

(71) Applicant: Shenzhen China Star Optoelectronics Technology Co., Ltd., Shenzhen (CN)

(72) Inventor: Lixuan Chen, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/122,886

(22) Filed: Sep. 6, 2018

(65) Prior Publication Data

US 2018/0366675 A1 Dec. 20, 2018

Related U.S. Application Data

(62) Division of application No. 15/119,381, filed on Aug. 16, 2016, now Pat. No. 10,164,204.

(30) Foreign Application Priority Data

Jun. 1, 2016 (CN) .......................... 2016 1 0388274

(51) Int. Cl.
*H01L 51/50* (2006.01)
*H01L 51/52* (2006.01)
*H01L 27/32* (2006.01)
*H01L 51/56* (2006.01)

(52) U.S. Cl.
CPC ............ *H01L 51/502* (2013.01); *H01L 27/32* (2013.01); *H01L 27/322* (2013.01); *H01L 51/52* (2013.01); *H01L 51/5253* (2013.01); *H01L 51/56* (2013.01); *H01L 2251/5369* (2013.01)

(58) Field of Classification Search
CPC ..................................................... H01L 51/502
See application file for complete search history.

(56) References Cited

U.S. PATENT DOCUMENTS

2017/0179438 A1* 6/2017 Xu

* cited by examiner

*Primary Examiner* — Daniel Whalen
(74) *Attorney, Agent, or Firm* — Leong C. Lei

(57) ABSTRACT

An OLED display device includes a substrate, an OLED layer located on the substrate, and a quantum dot package layer covering the OLED layer. The quantum dot package layer includes a quantum dot material. Blue light or white light emitting from the OLED layer excites the quantum dot material of the quantum dot package layer to emit light for color displaying with high color gamut.

5 Claims, 4 Drawing Sheets

OLED DISPLAY DEVICE HAVING WHITE OLEDS EMITTING WHITE LIGHT TO EXCITE QUANTUM DOTS

CROSS REFERENCE TO RELATED APPLICATIONS

This is a divisional application of co-pending U.S. patent application Ser. No. 15/119,381, filed on Aug. 16, 2016, which is a national stage of PCT Application No. PCT/CN2016/086730, filed on Jun. 22, 2016, claiming foreign priority of Chinese Patent Application No. 201610388274.1, filed on Jun. 1, 2016.

FIELD OF THE INVENTION

The present invention relates to a display technology field, and more particularly to an OLED display device.

BACKGROUND OF THE INVENTION

The Organic Light Emitting Diodes (OLED) display device possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The OLED display element is a self-emitting type display device, and generally comprises a pixel electrode and a common electrode respectively employed as being the anode and the cathode, and an organic light emitting layer positioned between the pixel electrode and the common electrode. As the proper voltages are applied to the anode and the cathode, the organic light emitting layer emits light. The organic light emitting layer comprises a Hole Injection Layer positioned on the anode, a Hole Transporting Layer positioned on the Hole Injection Layer, a light emitting layer positioned on the Hole Transporting Layer, an Electron Transport Layer positioned on the light emitting layer and an Electron Injection Layer positioned on the Electron Transport Layer. The lighting principle is that under certain voltage driving, the Electron and the Hole are respectively injected into the Electron Injection Layer and Hole Electron Injection Layer from the cathode and the anode. The Electron and the Hole respectively migrate from the Electron Transporting Layer and Hole Transporting Layer to the Emitting layer and bump into each other in the Emitting layer to form an exciton to excite the emitting molecule. The latter can illuminate after the radiative relaxation.

According to the different emissions of the lights, the OLED elements can be categorized to be the Top emission OLED and the Bottom emission OLED. The light emitted by the Top emission OLED is emitted from the top electrode. In comparison with the Bottom emission OLED which the light emitted thereby is emitted from the substrate at the bottom, the Top emission OLED has higher aperture ratio and light emitting efficiency. Because the OLED element can be easily influence by the external environments, such as water vapor and oxygen and thus the usage lifetime is shortened, there will be package structure provided outside the metal electrode of the top in general after the manufacture of the OLED element is accomplished.

The Quantumdots (QDs) light emitting material is a new technology applied in the display technology field. The Quantumdots light emitting material obeys the quantum size effect, and the properties change along with the size change of the quantum dots. As being stimulated by the light or the electricity, the quantum dots emit the colored light. The color of the light is related with the property. Thus, the emitted light can be controlled by changing the size thereof. The Quantumdots light emitting material possesses advantages of luminescence spectrum concentration and high color purity. While the Quantumdots light emitting material is employed in the display technology field, the gamut of the traditional display can be tremendously promoted to enhance the color reduction ability of the display, and it has become a popular development in the industry.

SUMMARY OF THE INVENTION

An objective of the present invention is to provide an OLED display device, having a simple structure, high display color gamut and high product competitiveness.

For realizing the aforesaid objective, the present invention first provides an OLED display device, comprising a substrate, an OLED layer located on the substrate, and a quantum dot package layer being located on the substrate and the OLED layer and covering the OLED layer; wherein the OLED layer comprises a plurality of red OLEDs, green OLEDs and blue OLEDs, which are aligned in array;

the quantum dot package layer comprises quantum dot material, and the quantum dot material is distributed in regions of the quantum dot package layer correspondingly above the blue OLEDs;

tops of the blue OLEDs emit blue light to excite the quantum dot material in the quantum dot package layer to emit light.

The substrate is a TFT array substrate.

The quantum dot package layer comprises a plurality of organic layers and inorganic layers, which alternately stack up; the quantum dot material is uniformly distributed in regions of at least one organic layer correspondingly above the blue OLEDs to construct units including quantum dots;

the OLED display device is a flexible display device, further comprising a barrier film located on the quantum dot package layer.

The quantum dot package layer comprises a layer of organic insulation layer; the quantum dot material is uniformly distributed in regions of the organic insulation layer correspondingly above the blue OLEDs to construct units including quantum dots;

the OLED display device further comprises package glue material located on the quantum dot package layer, and a packager cover plate located on the package glue material.

The units including quantum dots in the quantum dot package layer is manufactured and formed by Ink-Jet Printing.

The present invention further provides an OLED display device, comprising a substrate, an OLED layer located on the substrate, a quantum dot package layer being located on the substrate and the OLED layer and covering the OLED layer, and a color filter located on the quantum dot package layer; wherein wherein the OLED layer comprises a plurality of white light OLEDs, which are aligned in array;

the quantum dot package layer comprises quantum dot material, and the quantum dot material is distributed in regions of the quantum dot package layer correspondingly above the OLED layer;

the white light OLEDs emits white light from tops thereof to excite the quantum dot material in the quantum dot package layer to emit light.

The substrate is a TFT array substrate.

The quantum dot package layer comprises a plurality of organic layers and inorganic layers, which alternately stack up; the quantum dot material is uniformly distributed in regions of at least one organic layer correspondingly above the blue OLEDs to construct units including quantum dots;

the OLED display device is a flexible display device, further comprising a barrier film located on the color filter.

The quantum dot package layer comprises a layer of organic insulation layer; the quantum dot material is uniformly distributed in the organic insulation layer to construct units including quantum dots;

the OLED display device further comprises package glue material located on the color filter, and a packager cover plate located on the package glue material.

The units including quantum dots in the quantum dot package layer is manufactured and formed by Ink-Jet Printing.

The present invention further provides an OLED display device, comprising a substrate, an OLED layer located on the substrate, and a quantum dot package layer being located on the substrate and the OLED layer and covering the OLED layer; wherein the OLED layer comprises a plurality of red OLEDs, green OLEDs and blue OLEDs, which are aligned in array;

the quantum dot package layer comprises quantum dot material, and the quantum dot material is distributed in regions of the quantum dot package layer correspondingly above the blue OLEDs;

tops of the blue OLEDs emit blue light to excite the quantum dot material in the quantum dot package layer to emit light;

wherein the substrate is a TFT array substrate;

wherein the quantum dot package layer comprises a plurality of organic layers and inorganic layers, which alternately stack up; the quantum dot material is uniformly distributed in regions of at least one organic layer correspondingly above the blue OLEDs to construct units including quantum dots;

the OLED display device is a flexible display device, further comprising a barrier film located on the quantum dot package layer.

The benefits of the present invention are: the present invention provides an OLED display device, comprising a substrate, an OLED layer located on the substrate, and a quantum dot package layer covering the OLED layer, and the quantum dot package layer comprises quantum dot material; the blue light or the white light emitted by the OLED layer excites the quantum dot material of the quantum dot package layer to emit light to achieve the color display of the high color gamut while not adding additional structures, and the product competitiveness is high.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
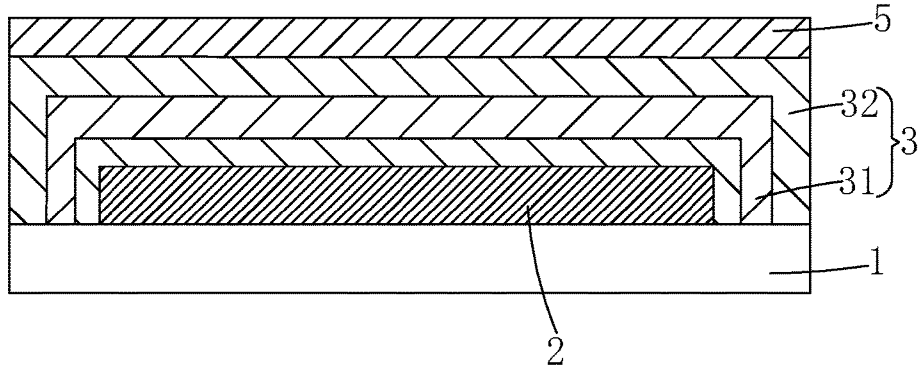
FIG. 1 is a structure diagram of the first embodiment according to the OLED display device of the present invention.

Please refer to FIG. 1, which is a structure diagram of the first embodiment according to the OLED display device of the present invention. The OLED display device of this embodiment is a flexible OLED display device, comprising a substrate 1, an OLED layer 2 located on the substrate 1, a quantum dot package layer 3 being located on the substrate 1 and the OLED layer 2 and covering the OLED layer 2, and a barrier film 5 located on the quantum dot package layer 3.

Specifically, the OLED layer 2 comprises a plurality of red OLEDs 21, green OLEDs 22 and blue OLEDs 23, which are aligned in array.

Specifically, the quantum dot package layer 3 comprises quantum dot material 40, and the quantum dot material 40 is distributed in regions of the quantum dot package layer 3 correspondingly above the blue OLEDs 23.

Figure 2:
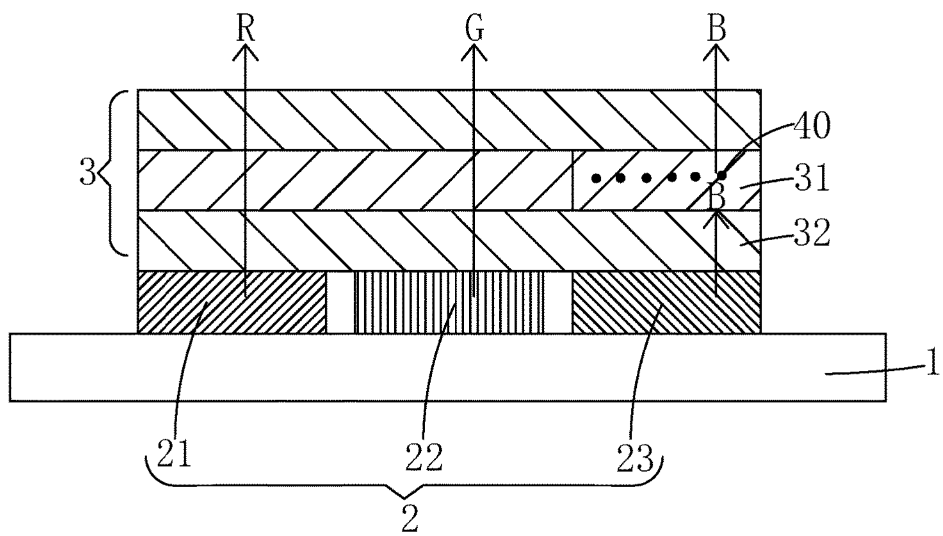
FIG. 2 is a diagram of optical paths of realizing color display in the first embodiment according to the OLED display device of the present invention.

Specifically, as shown in FIG. 2, tops of the blue OLEDs 23 emit blue light to excite the quantum dot material 40 in the quantum dot package layer 3 to emit light, and thus to effectively raise the color gamut of the OLED display device and to promote the product competitiveness.

Specifically, the substrate 1 is a TFT array substrate, and the TFT thereon respectively drive the red OLEDs 21, the green OLEDs 22 and the blue OLEDs 23 of the OLED layer 2 to emit red, green, blue lights.

Specifically, the quantum dot package layer 3 comprises a plurality of organic layers 31 and inorganic layers 32, which alternately stack up; the quantum dot material 40 is uniformly distributed in regions of at least one organic layer 31 correspondingly above the blue OLEDs 23 to construct units including quantum dots; wherein material of the inorganic layers 32 is silicon nitride (SiNx), which is formed by Chemical Vapor Deposition (CVD); material of the organic layers 31 is polymer, which is formed by spin coating or Ink-Jet Printing (IJP).

Specifically, the units including quantum dots in the quantum dot package layer 3 is manufactured and formed by Ink-Jet Printing. The specific manufacture process is: doping the quantum dot material 40 in the polymer of the organic layers 31, and then forming units including quantum dots in the quantum dot package layer 3 correspondingly above the blue OLEDs 23 by Ink-Jet Printing, and thus to uniformly distribute the quantum dot material 40 in regions of the organic layer 31 correspondingly above the blue OLEDs 23; because the quantum dot material 40 can be uniformly and efficiently distributed dispersed in the spray solvent, the manufacture process is simple, and meanwhile, will not cause the pollution to other materials.

Figure 3:
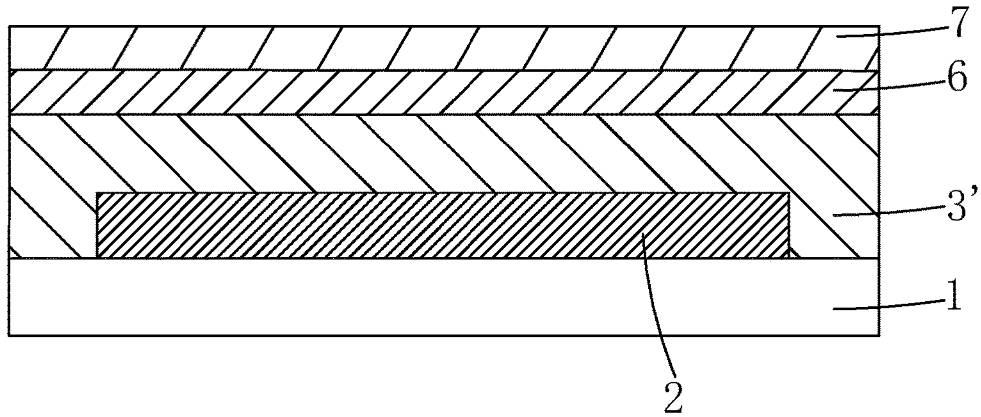
FIG. 3 is a structure diagram of the second embodiment according to the OLED display device of the present invention.

Please refer to FIG. 3, which is a structure diagram of the second embodiment according to the OLED display device of the present invention. In comparison with the aforesaid first embodiment, the OLED display device of the embodiment is employed in the large scale OLED display device, comprising a substrate 1, an OLED layer 2 located on the substrate 1, a quantum dot package layer 3' being located on the substrate 1 and the OLED layer 2 and covering the OLED layer 2, and package glue material 6 located on the quantum dot package layer 3', and a packager cover plate 7 located on the package glue material 6; the quantum dot package layer 3' comprises quantum dot material 40, and the quantum dot material 40 is distributed in the region of the quantum dot package layer 3' correspondingly above the blue OLED 23.

Figure 4:
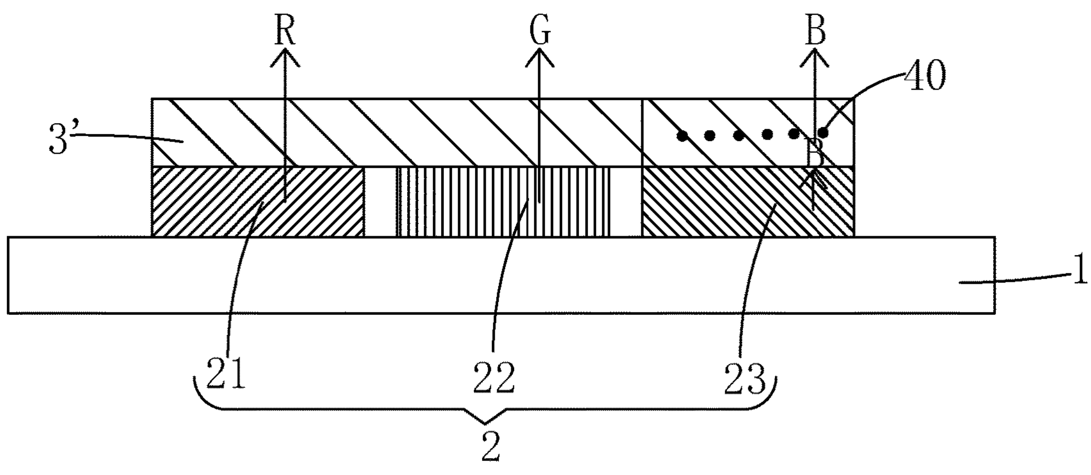
FIG. 4 is a diagram of optical paths of realizing color display in the second embodiment according to the OLED display device of the present invention.

Specifically, the quantum dot package layer 3' is a single layer structure, comprising a layer of organic insulation layer, and the organic insulation layer is organic insulation material, and as shown in FIG. 4, the quantum dot material 40 is uniformly distributed in regions of the organic insulation layer correspondingly above the blue OLEDs 23, and thus to construct units including quantum dots.

Furthermore, the units including quantum dots in the quantum dot package layer 3' is manufactured and formed by Ink-Jet Printing. The reset is the same as the first embodiment, and the repeated description is omitted here.

Figure 5:
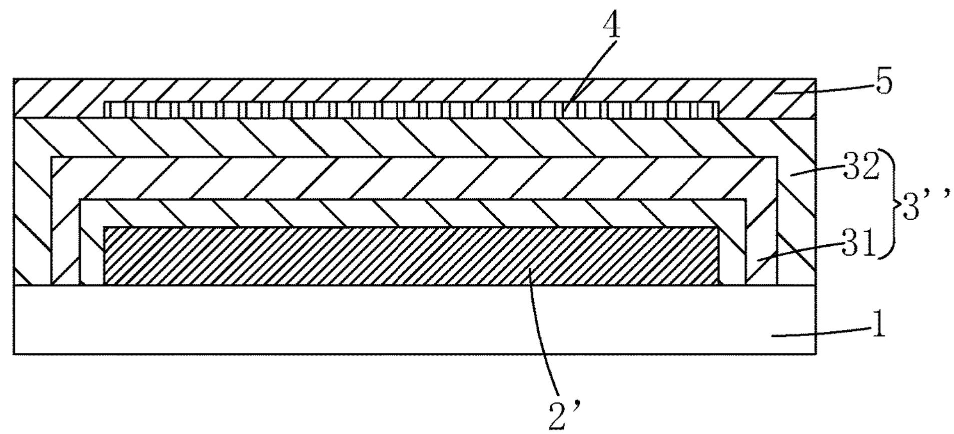
FIG. 5 is a structure diagram of the third embodiment according to the OLED display device of the present invention.

Please refer to FIG. 5, is a structure diagram of the third embodiment according to the OLED display device of the present invention. The OLED display device of this embodiment is a flexible OLED display device, and also a white light OLED display device. The OLED display device specifically comprises: a substrate 1, an OLED layer 2' located on the substrate 1, a quantum dot package layer 3" being located on the substrate 1 and the OLED layer 2' and covering the OLED layer 2', a color filter 4 located on the quantum dot package layer 3" and a barrier film 5 located on the color filter 4.

Specifically, the OLED layer 2' comprises a plurality of white light OLEDs 21', which are aligned in array.

Specifically, the quantum dot package layer 3" comprises quantum dot material 40, and the quantum dot material 40 is distributed in regions of the quantum dot package layer 3" correspondingly above the OLED layer 2'.

Specifically, the color filter 4 comprises red, green, blue light resist units 41, 42, 43 which are alternately aligned.

Figure 6:
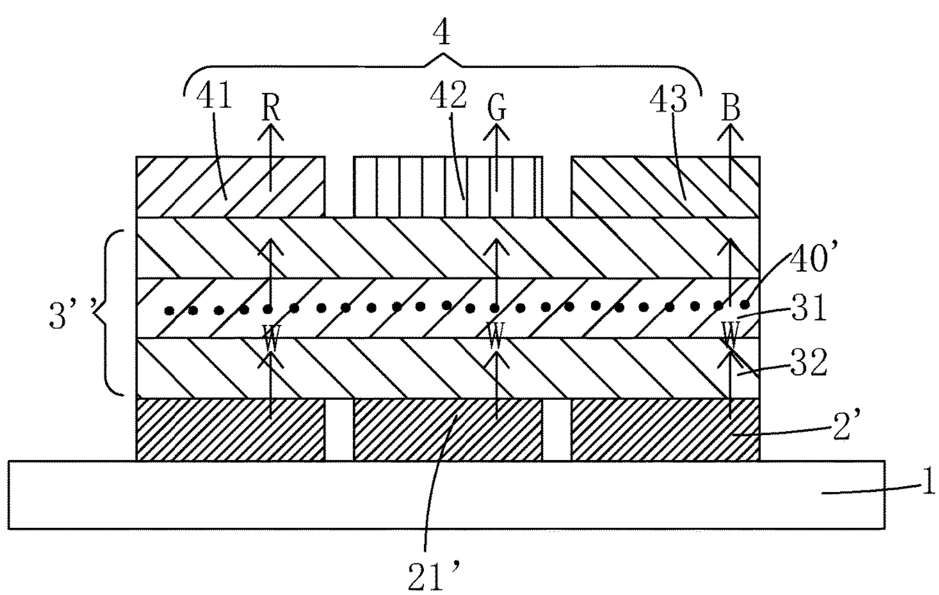
FIG. 6 is a diagram of optical paths of realizing color display in the third embodiment according to the OLED display device of the present invention.

Specifically, as shown in FIG. 6, the white light OLEDs 21' emits white light from tops thereof to excite the quantum dot material 40 in the quantum dot package layer 3" to emit light. Then, the excited light passes through the red, green, blue light resist units 41, 42, 43 of the color filter 4 to respectively emit the red, green, blue light, and thus to achieve the color display. Meanwhile, the color gamut of the OLED display device can be effectively raised to promote the product competitiveness.

Specifically, the substrate 1 is a TFT array substrate, and the TFTs thereon drive the white light OLED 21' of the OLED layer 2' to emit white light.

Specifically, the quantum dot package layer 3" comprises a plurality of organic layers 31 and inorganic layers 32, which alternately stack up; the quantum dot material 40 is uniformly distributed in regions of at least one organic layer 31 correspondingly above the blue OLEDs to construct units including quantum dots; wherein material of the inorganic layers 32 is silicon nitride, and formed by chemical vapor deposition; material of the organic layers 31 is polymer, which is formed by spin coating or Ink-Jet Printing.

Specifically, the units including quantum dots in the quantum dot package layer 3" is manufactured and formed by Ink-Jet Printing. The specific manufacture process is: doping the quantum dot material 40 in the polymer of the organic layers 31, and then forming units including quantum dots in the organic layers 31 by Ink-Jet Printing; because the quantum dot material 40 can be uniformly and efficiently distributed dispersed in the spray solvent, the manufacture process is simple, and meanwhile, will not cause the pollution to other materials.

Figure 7:
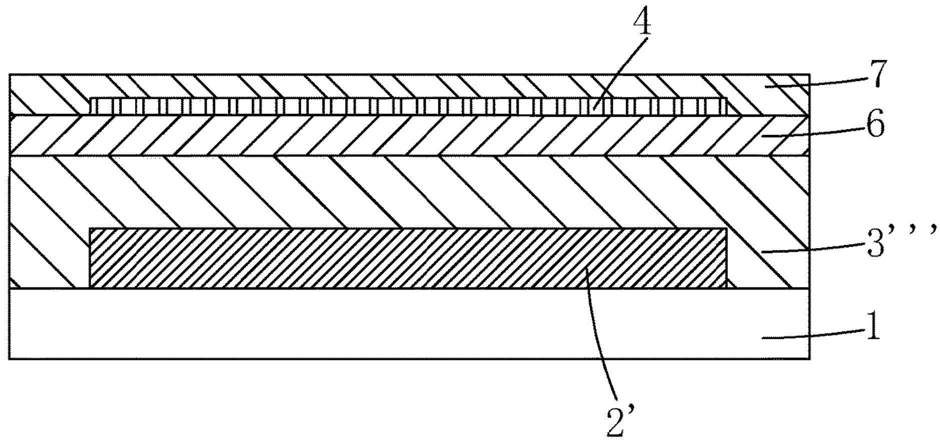
FIG. 7 is a structure diagram of the fourth embodiment according to the OLED display device of the present invention.

Please refer to FIG. 7, is a structure diagram of the fourth embodiment according to the OLED display device of the present invention. In comparison with the aforesaid first embodiment, the OLED display device of the embodiment is employed in the large scale OLED display device, comprising a substrate 1, an OLED layer 2' located on the substrate 1, a quantum dot package layer 3'" being located on the substrate 1 and the OLED layer 2' and covering the OLED layer 2', a color filter 4 located on the quantum dot package layer 3'" and package glue material 6 located on the color filter 4, and a packager cover plate 7 located on the package glue material 6. Specifically, the quantum dot package layer 3'" comprises quantum dot material 40, and the quantum dot material 40 is distributed in regions of the quantum dot package layer 3'" correspondingly above the OLED layer 2'.

Figure 8:
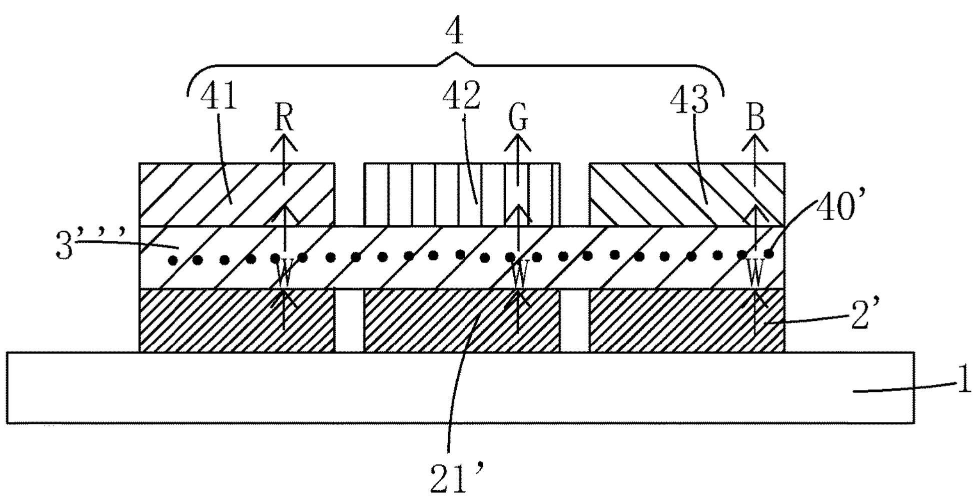
FIG. 8 is a diagram of optical paths of realizing color display in the fourth embodiment according to the OLED display device of the present invention.

Specifically, the quantum dot package layer 3'" is a single layer structure, comprising a layer of organic insulation layer, and the organic insulation layer is organic insulation material, and as shown in FIG. 8, the quantum dot material 40 is uniformly distributed in the organic insulation layer, and thus to construct units including quantum dots.

Furthermore, the units including quantum dots in the quantum dot package layer 3'" is manufactured and formed by Ink-Jet Printing. The reset is the same as the third embodiment, and the repeated description is omitted here.

In conclusion the OLED display device of the present invention comprises a substrate, an OLED layer located on the substrate, and a quantum dot package layer covering the OLED layer, and the quantum dot package layer comprises quantum dot material; the blue light or the white light emitted by the OLED layer excites the quantum dot material of the quantum dot package layer to emit light to achieve the color display of the high color gamut while not adding additional structures, and the product competitiveness is high.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An Organic Light Emitting Diode (OLED) display device, comprising a substrate, an OLED layer located on the substrate, a quantum dot package layer located on the substrate and the OLED layer and covering the OLED layer, and a color filter located on the quantum dot package layer;

wherein the OLED layer comprises a plurality of white light OLEDs, which are arranged in an array;

the quantum dot package layer comprises a quantum dot material, which is distributed in a region of the quantum dot package layer located above and corresponding to the OLED layer; and the white light OLEDs emit white light from tops thereof to excite the quantum dot material in the quantum dot package layer to emit light; and wherein the OLED layer located on the substrate has surfaces exposed outside the substrate and the quantum dot package layer covers the surfaces of the OLED layer that are exposed outside the substrate so that the OLED layer is enclosed between the quantum dot package layer and the substrate.

2. The OLED display device according to claim 1, wherein the substrate is a thin film transistor (TFT) array substrate.

3. The OLED display device according to claim 1, wherein the quantum dot package layer comprises a plurality of organic layers and inorganic layers, which alternately stack up; and the quantum dot material is uniformly distributed in a region of at least one of the plurality of organic layers to form units including quantum dots; and wherein the OLED display device is a flexible display device and further comprises a barrier film located on the color filter.

4. The OLED display device according to claim 1, wherein the quantum dot package layer comprises an organic insulation layer; and the quantum dot material is uniformly distributed in the organic insulation layer to form units including quantum dots; and wherein the OLED display device further comprises a package glue material located on the color filter, and a packager cover plate located on the package glue material.

5. The OLED display device according to claim 4, wherein the units including quantum dots in the quantum dot package layer are manufactured and formed through ink-jet printing.

* * * * *